United States Patent
Oka et al.

(10) Patent No.: US 6,228,452 B1
(45) Date of Patent: *May 8, 2001

(54) ADHESIVE TAPE FOR ELECTRONIC PARTS

(75) Inventors: Osamu Oka; Takeshi Nishigaya; Jun Tochihira; Fumiki Komagata, all of Shizuoka (JP)

(73) Assignee: Tomoegawa Paper Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/015,334

(22) Filed: Jan. 29, 1998

(30) Foreign Application Priority Data

Jan. 30, 1997 (JP) .................................................. 9-029817

(51) Int. Cl.⁷ ............................................. C09J 7/02
(52) U.S. Cl. ..................... 428/41.8; 428/344; 428/352; 428/354; 428/355 N
(58) Field of Search .................. 428/354, 355 N, 428/41.8, 344, 352

(56) References Cited

U.S. PATENT DOCUMENTS

| 5,091,251 | * | 2/1992 | Sakumoto . |
| 5,851,616 | * | 12/1998 | Oka . |
| 5,866,250 | * | 2/1999 | Oka . |

FOREIGN PATENT DOCUMENTS

| 6-291236 | 10/1994 | (JP) . |
| 8-325533 | 12/1996 | (JP) . |
| 9-67559 | 3/1997 | (JP) . |

* cited by examiner

*Primary Examiner*—Blaine Copenheaver
(74) *Attorney, Agent, or Firm*—McDermott, Will & Emery

(57) ABSTRACT

This invention provide an adhesive tape for electronic parts having sufficient thermal resistance and reliability. The adhesive tape comprises a metal substrate, an adhesive layer A and an adhesive layer B laminated in order, wherein said adhesive layers A and B are resin layers composed of 100–40% by mol of at least a polyimide comprising the repeating unit represented by the formula (1) and 0–60% by mol of the repeating unit represented by the formula (2), said two adhesive layers having each a different glass transition temperature:

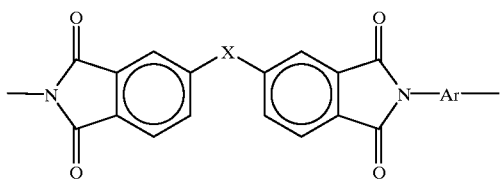

(1)

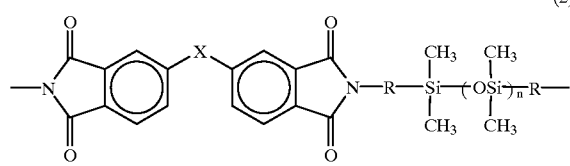

(2)

wherein X is —$SO_2$— and/or —C(=O)—$OCH_2CH_2O$—C(=O)—, Ar is a divalent group containing aromatic rings, and R is an alkylene group having 1 to 10 carbon atoms or —$CH_2OC_6H_4$—, and n means an integer of 1 to 20.

7 Claims, 1 Drawing Sheet

PRIOR ART

ADHESIVE TAPE FOR ELECTRONIC PARTS

BACKGROUND OF THE INVENTION

1. Field of the Invention

The present invention relates to adhesive tapes for electronic parts to be used as adhesive tapes for fixing the leadframe, TAB tapes or for adhering between parts around leadframes making up a semiconductor device, e.g., lead pins, semiconductor chip mounted substrates, heat spreader, semiconductors themselves.

2. Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a semiconductor chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strength at room temperature immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising polyacrylonitrile, polyacrylate or a synthetic rubber resin such as acrylonitrile-butadiene copolymer solely, or modified with any other resin or blended with any other resin to come into a B-stage. Adhesive tapes using heat resisting thermoplastic polyimide resin have been utilized recently.

In recent years, resin-molded type semiconductor devices (semiconductor packages) as shown in FIG. 2 have been developed or produced. In FIG. 2, the device has a construction in which lead pins 3 and metal plane 2 are connected by means of an adhesive layer 6, a semiconductor chip 1 is mounted on the metal plane 2, and together with bonding wires 4 between the semiconductor chip 1 and the lead pins 3, they are molded with a resin 5. In general, unilayer adhesive or both-sided adhesive layer is used as the adhesive layer 6.

In the adhesive layer in the resin-molded type semiconductor devices shown in FIG. 2, the use of an adhesive tape to which a conventional adhesive is applied has the problems that the generated gas stains the lead to cause deterioration of the adhesive strength or causes generation of package crack, because of insufficient heat resistance. It is therefore required to develop adhesives for electronic parts having sufficient heat resistance and reliability and adhesive tapes for electronic parts using them.

The present inventor has solved before the above problems by inventing adhesive tapes using an adhesive containing a polyimide composed of repeating units represented by the below-described formulas (1a) and (2b). (Japanese Patent Application Laid-open Nos. 325533/1996 and 67559/1997).

These adhesive tapes however have various problems. For example, there is a problem of easily causing interfacial separation of the adhesive layer from the heat resistant film in the case that the adhesive layer is formed on the heat resistant film. In particular, the interfacial separation at high humidity and high temperature becomes a serious problems because of causing remarkable deterioration of reliability of semiconductor packages. In the case of an adhesive tape consisting only of an adhesive layer, there is the problem that insulation becomes difficult to assure when the tape is bonded under pressure with heat, because the leadframe is embedded in and pierces the adhesive layer.

In the prior semiconductor devices, the leadframe and the plane previously prepared are bonded under pressure with heat by means of a both-sided adhesive tape which was cut by means of a dies. It is therefore necessary to change the dies for cutting the adhesive tape according to the shapes of the leadframe and the plane.

Japanese Patent Application Laid-open No. 291236/1994 discloses a method of bonding heat radiator to the lead frame in the semi-conductor device with an adhesive tape comprising polyimide adhesive layers having each a different glass transition temperature (Tg). However, there is no detailed description concerning component of the adhesive to be used. Since adhesives having each a different molecular structure, the disclosed semiconductor device has the problem that interfacial separation between or on the adhesive layers is easily caused to result in sufficient adhesion between the adhesive layers and insufficient electric reliability.

The present invention has been made for the purpose of solving such problems in the prior arts. Namely, an object of the present invention is to provide an adhesive tape for electronic parts capable of adhesion at a relatively low temperature, with keeping electrical insulation and having sufficient reliability.

SUMMARY OF THE INVENTION

The adhesive tape for electronic parts of the present invention is characterized by comprising at least a metal substrate, an adhesive layer A and an adhesive layer B laminated in order, wherein said adhesive layers A and B are resin layers composed of 100–40% by mol of at least a polyimide comprising at least one of the repeating units represented by the following formulas (1a) and (1b) and 0–60% by mol of at least one of the repeating units represented by the following formulas (2a) and (2b), said two adhesive layers having each a different glass transition temperature:

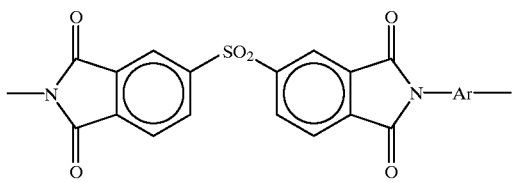

(1a)

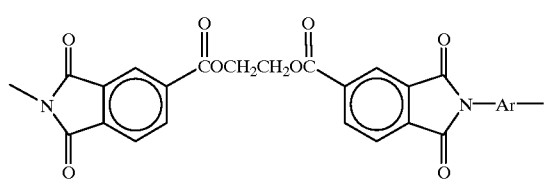

(1b)

wherein Ar represents a divalent group selected from the following formulas containing aromatic rings:

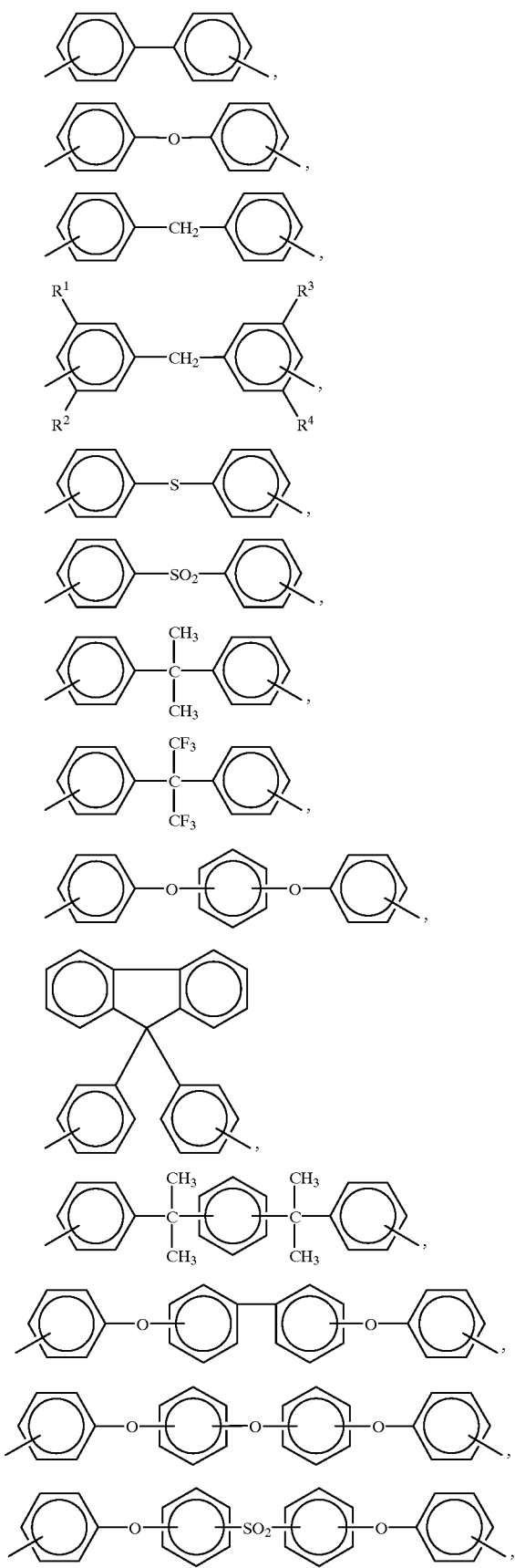

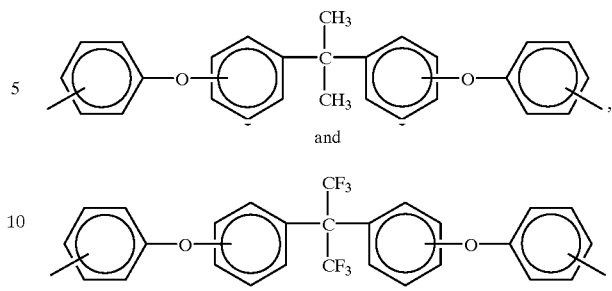

wherein $R^1$, $R^2$, $R^3$ and $R^4$ which may be identical or different represent each a hydrogen atom, an alkyl group having 1–4 carbon atoms or an alkoxy group having 1–4 carbon atoms, provided that $R^1$, $R^2$, $R^3$ and $R^4$ are not hydrogen atoms at the same time.

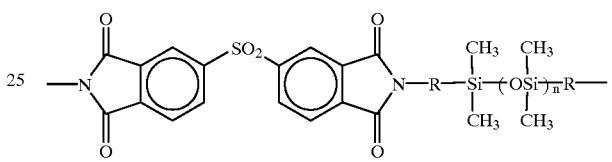

(2a)

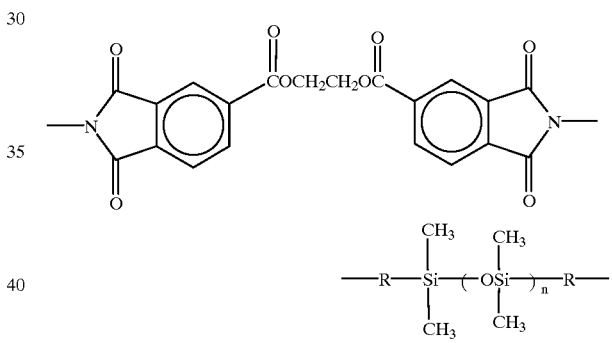

(2b)

wherein R is an alkylene group having 1 to 10 carbon atoms or —$CH_2OC_6H_4$—, the methylene group of which attaches to Si, and n means an integer of 1 to 20.

DETAILED DESCRIPTION OF PREFERRED EMBODIMENTS

The embodiments of the present invention will now be described in detail.

Figure 1:
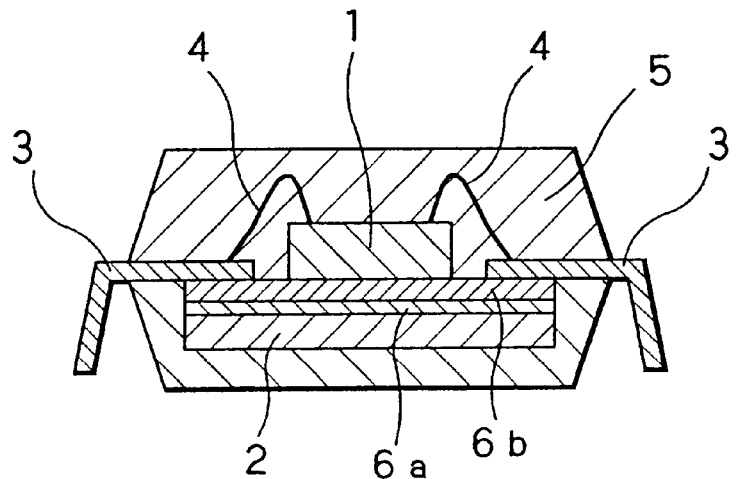
FIG. 1 is a cross-sectional view of an embodiment of a resin-molded type semiconductor device using an adhesive tape of the present invention.
Figure 2:
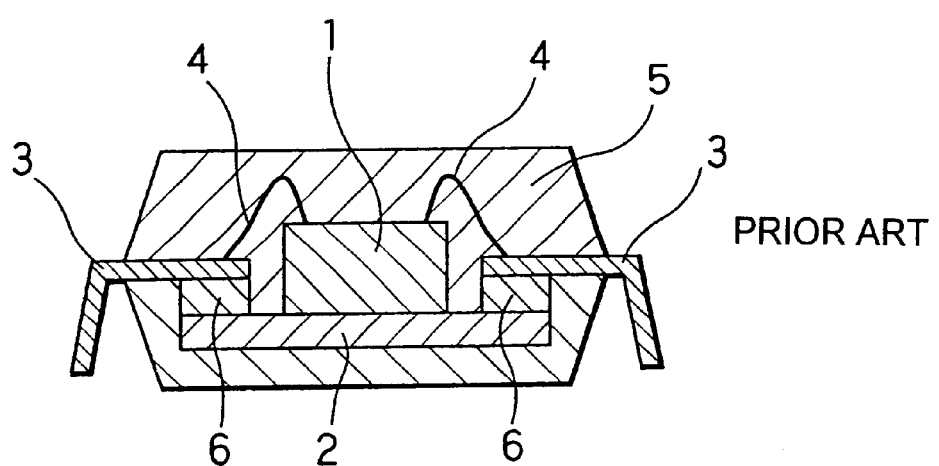
FIG. 2 is a cross-sectional view of an embodiment of a resin-molded type semiconductor device using an adhesive tape of the conventional adhesive tape.

FIG. 1 shows a cross-sectional view of an embodiment of a resin-molded type semiconductor device using the adhesive tape of the present invention. In the FIG. 1, lead pins 3 and the metal substrate 2 of the adhesive tape are connected by means of adhesive layers 6a and 6b having each different glass transition temperature which are composed of the above mentioned polyimides, a semiconductor chip 1 is mounted on the metal substrate 2, and they are molded with a resin 5 together with bonding wires 4 between the semiconductor chip 1 and the lead pins 3.

The metal substrate used in the present invention is not restricted, if it has heat radiation ability. The metal substrate is preferred to have the thickness of from 10–300 μm, which is composed of at least one selected from the group consisting of copper, cupro-nickel, silver, iron, 42-alloy and stainless steel.

The polyimides used in the present invention are those which contain 100–40% by mol of at least one of repeating units represented by the following formulas (1a) and (1b). In this case, the polyimide contains "at least one of the repeating units represented by the formulas (1a) and (1b)" includes polyimides containing the repeating unit represented by the formula (1a) alone, polyimides containing the repeating unit represented by the formula (1b) alone, and polyimides containing both the repeating units represented by the formulas (1a) and (1b).

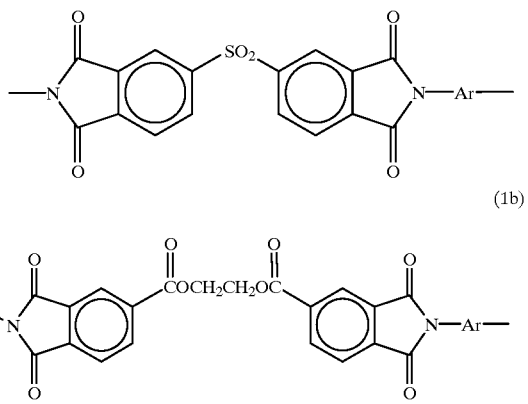

wherein Ar is the same meaning as described above.

The polyimides used in the present invention are those which contain 0–60% by mol of at least one of repeating units represented by the following formulas (2a) and (2b). In this case, the polyimide contains "at least one of the repeating units represented by the formulas (2a) and (2b)" includes polyimides containing the repeating unit represented by the formula (2a) alone, polyimides containing the repeating unit represented by the formula (2b) alone, and polyimides containing both the repeating units represented by the formulas (1a) and (1b).

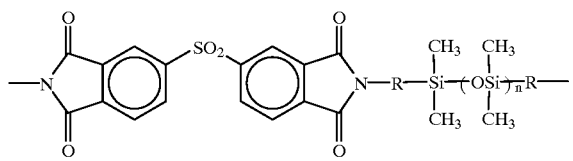

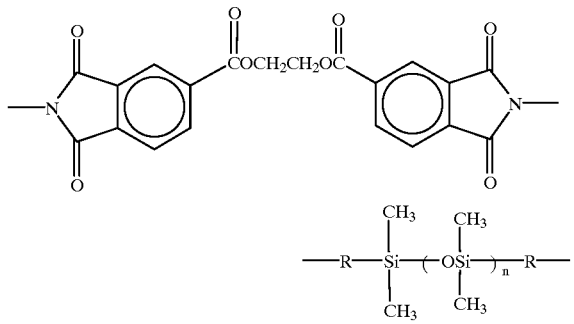

wherein R and n are each the same meaning as described above.

In the above described polyimide, the greater the proportion of the repeating units represented by the formulas (1a) and (1b) (referred to as [(1a)+(1b)] herein after) is, the higher the glass transition temperature becomes, while the greater the proportion of the repeating units represented by the formulas (2a) and (2b) (referred to as [(2a)+(2b)] herein after) is, the lower the glass transition temperature becomes. Accordingly, it is possible to control a temperature capable of adhering the adhesive by controlling glass transition temperature of the polyimide.

The above polyimides to be used in the present invention can be produced according to conventional processes for producing polyimides. In concrete, they can be produced from tetracarboxylic dianhydrides corresponding to the desired repeating units and diamines or diisocyanates corresponding to the desired repeating unit.

Typically, the above polyimide can be produced by reacting tetracarboxylic dianhydrides represented by the following formula (3a) and/or (3b) with a compound represented by the following formula (4) and/or a siloxane compound represented by the following formula (5).

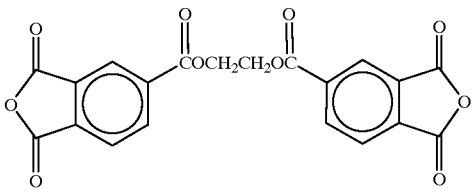

$$Y-Ar-Y \quad (4)$$

wherein Ar is the same meaning as described above and Y is an amino group or an isocyanate group.

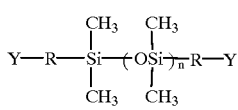

(5)

wherein R is an alkylene group having 1 to 10 carbon atoms or —CH$_2$OC$_6$H$_4$—, the methylene group of which attaches to Si, Y is an amino group or an isocyanate group, and n means an integer of 1 to 20.

Examples of tetracarboxylic dianhyrides represented by the formulas (3a) and (3b) which are used as raw materials for producing the polyimide and form the basic construction of them are 3,3',4,4'-diphenylsulfonetetracarboxylic dianhydride and ethylene glycol bistrimellitate dianhydride, respectively.

Examples of the compound represented by the formula (4) include those wherein Ar is a divalent group selected from the above mentioned formulas having aromatic rings. Typical examples of the compound wherein the functional group Y is an amino group include the following diamines: 3,3'-diaminobiphenyl, 3,4'-diaminobiphenyl, 4,4'-diaminobiphenyl, 3,3'-diaminodiphenylmethane, 3,4'-diaminodiphenylmethane, 4,4'-diaminodiphenylmethane, 2,2-(3,3'-diaminodiphenyl)propane, 2,2-(3,4'-diaminodiphenyl)propane, 2,2-(4,4'-diaminodiphenyl)propane, 2,2-(3,3'-diaminodiphenyl)hexafluoropropane, 2,2-(3,4'-diaminodiphenyl)hexafluoropropane, 2,2-(4,4'-diaminodiphenyl)hexafluoropropane, 3,3'-oxydianiline, 3,4'-oxydianiline, 4,4'-oxydianiline, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 1,3-bis[1-(3-aminophenyl)-1-methylethyl]benzene, 1,3-bis[1-(4-aminophenyl)-1-methylethyl]benzene, 1,4-bis[1-(3-aminophenyl)-1-methylethyl]benzene, 1,4-bis[1-(4-aminophenyl)-1-methylethyl]benzene, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 3,3'-bis(3-aminophenoxy)diphenyl ether, 3,3'-bis(4-aminophenoxy)diphenyl ether, 3,4'-bis(3-aminophenoxy)-diphenyl ether, 3,4'-bis(4-aminophenoxy) diphenyl ether, 4,4'-bis(3-aminophenoxy)diphenyl ether, 4,4'-bis(4-aminophenoxy)diphenyl ether, 3,3'-bis(3-aminophenoxy)biphenyl, 3,3'-bis(4-aminophenoxy) biphenyl, 3,4'-bis(3-aminophenoxy)biphenyl, 3,4'-bis(4-aminophenoxy)biphenyl, 4,4'-bis(3-aminophenoxy) biphenyl, 4,4'-bis(4-aminophenoxy)biphenyl, bis[4-(3-aminophenoxy)phenyl]sulfone, bis[4-(4-aminophenoxy) phenyl]sulfone, 2,2-bis[3-(3-aminophenoxy)phenyl] propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]hexafluoropropane, 2,2-bis[3-(4-aminophenoxy)phenyl]hexafluoropropane, 2,2-bis[4-(3-aminophenoxy)phenyl]hexafluoropropane, 2,2-bis[4-(4-aminophenoxy)phenyl]hexafluoropropane, 9,9-bis(3-aminophenyl)fluorene, 9,9-bis(4-aminophenyl)fluorene, 3,3'-diamino-2,2',4,4'-tetramethyldiphenylmethane, 3,3'-diamino-2,2',4,4'-tetraethyldiphenylmethane, 3,3'-diamino-2,2',4,4'-tetrapropyldiphenylmethane, 3,3'-diamino-2,2',4,4'-tetraisopropyldiphenylmethane, 3,3'-diamino-2,2',4,4'-tetrabutyldiphenylmethane, 3,4'-diamino-2,3',4,5'-tetramethyldiphenylmethane, 3,4'-diamino-2,3',4,5'-tetraethyldiphenylmethane, 3,4'-diamino-2,3',4,5'-tetrapropyldiphenylmethane, 3,4'-diamino-2,3',4,5'-tetraisopropyldiphenylmethane, 3,4'-diamino-2,3',4,5'-tetrabutyldiphenylmethane, 4,4'-diamino-3,3',5,5'-tetramethyldiphenylmethane, 4,4'-diamino-3,3',5,5'-tetraethyldiphenylmethane, 4,4'-diamino-3,3',5,5'-tetrapropyldiphenylmethane, 4,4'-diamino-3,3',5,5'-tetraisopropyldiphenylmethane, 4,4'-diamino-3,3',5,5'-tetrabutyldiphenylmethane, 4,4'-diamino-3,3'-diethyl-5,5'-dimethyldiphenylmethane, 4,4'-diamino-3,3'-dimethyldiphenylmethane, 4,4'-diamino-3,3'-diethyldiphenylmethane, 4,4'-diamino-3,3',5,5'-tetramethoxydiphenylmethane, 4,4'-diamino-3,3',5,5'-tetraethoxydiphenylmethane, 4,4'-diamino-3,3',5,5'-tetrapropoxydiphenylmethane, 4,4'-diamino-3,3',5,5'-tetrapropoxydiphenylmethane, 4,4'-diamino-3,3',5,5'-tetraisopropoxydiphenylmethane, 4,4'-diamino-3,3',5,5'-tetrabutoxydiphenylmethane, 4,4'-diamino-3,3'-dimethoxydiphenylmethane, 4,4'-diamino-3,3'-diethoxydiphenylmethane and the like.

Examples of diisocyanates which are the compounds represented by the formula (4) wherein the functional group Y is an isocyanate group include those exemplified in the above mentioned diamines in which "amino" is replaced by "isocyanate".

Examples of the diamines in the compounds represented by the formula (5) wherein the functional group Y is an amino group include bis(3-aminopropyl) tetramethyldisiloxane, bis(10-aminodecamethylene) tetramethyldisiloxane, tetramer and octamer of dimethylsiloxane having aminopropyl at the terminal, bis(3-aminophenoxymethyl)tetramethyldisiloxane, etc. They can be used as a mixture.

Examples of the diisocyanates in the compounds represented by the formula (5) wherein the functional group Y is an isocyanate include those exemplified in the above diamines wherein "amino" is replaced by "isocyanate".

The diisocyanates wherein the functional group Y in the above mentioned formulas (4) and (5) is an isocyanate group can be easily produced by reacting the above exemplified corresponding diamine with phosgene.

The polyimides of the present invention can be produced as follows.

Examples of processes for producing the polyimide using tetracarboxylic dianhyrides and diamines as the raw materials for the polyimide include the following. A process for directly obtaining a polyimide by heating a tetracarboxylic dianhyrides and diamines in an organic solvent, optionally in the presence of a catalyst (in an amount of not more than 20 parts by weight of the reactants) such as tributylamine, triethylamine, or triphenyl phosphate to a temperature of not less than 100° C., and preferably not less than 180° C. A process for obtaining a polyimide by reacting tetracarboxylic dianhyrides with diamines in an organic solvent at a temperature of not more than 100° C. to obtain a polyamic acid which is a precursor of the polyimide, optionally adding a dehydrating such as p-toluenesulfonic acid (in an amount of 1 to 5 times the mol of the tetracarboxylic dianhydride), and then heating the solution to cause an imidation. A process in which the above-mentioned polyamic acid is caused to a ring closing reaction at a relatively low temperature (in a range from room temperature to 100° C.) by adding dehydrating ring closing agent such as an anhydride, e.g., acetic anhydride, propionic anhydride or benzoic anhydride, a carbodiimide compound, e.g., dicyclohexylcarbodiimide, and optionally a ring closing catalyst such as pyridine, isoquinoline, imidazole and triethylamine (as for the dehydrating ring closing agent and ring closing catalyst, in an amount of 2 to 10 times the mol of the tetracarboxylic dianhydride).

Examples of the organic solvents used in these reactions include aprotic polar solvents such as N-methyl-2-pyrrolidone, N,N-dimethylacetamide, N,N-dimethylformamide, dimethylsulfoxide, sulforane, hexamethylphosphoric acid triamide, and 1,3-dimethyl-2-imidazolidone, and phenol solvents such as phenol, cresol, xylenol, and p-chlorophenol. Optionally, solvents such as benzene, toluene, xylene, methyl ethyl ketone, acetone, tetrahydrofuran, dioxane, monoglyme, diglyme, methyl cellosolve, cellosolve acetate, methanol, ethanol, isopropanol, methylene chloride, chloroform, trichloroethylene, and nitrobenzene can be mixed with the above-mentioned solvents as a mixture.

In the case where tetracarboxylic dianhydrides and diisocyanates are used as the raw materials, the product can be produced according to the above-mentioned process for directly obtaining a polyimide. In this case, the reaction temperature is preferably not less than room temperature, and particularly not less than 60° C. The polyimide having a high polymerization degree can be produced by the reaction between equimolar amounts of the tetracarboxylic dianhydrides and the diamines or diisocyanates. If necessary, either of them is capable of using in an excess amount of less than 10% by mol.

Since the film formability depends upon molecular weight of the polyimide used in the present invention, the molecular weight can be optimally decided according to desired film formability. When being used in the present invention, polyimide having too low molecular weight is not preferred because film formability in some degree is required in the adhesive layer even in the case of the liquid form and the heat resistance is also lowered. In the present invention, the molecular weight is required to be not less than 4,000. When being used as a thermoplastic adhesive, the adhesion is changed for the worse, if the viscosity during the melting is too high. The molecular weight is a factor for controlling the viscosity during the melting. In the case of the polyimide used in the present invention, number molecular weight is approximately not more than 400,000. If the molecular weight is higher than this value, it becomes difficult to use as an adhesive because of increasing the viscosity.

In present invention, though the above mentioned polyimides are used alone in the adhesive layers A and B which are laminated on the metal substrate in order, two or more kinds selected from the above described polyimides may be suitably mixed in order to control the glass transition temperature (Tg). It is more preferred that Tg of the adhesive layer A is at least 40° C. higher than that of the adhesive layer B in viewpoint of adhesion time, adhesion pressure and temperature for producing the electronic parts.

The adhesive layers A and B of the adhesive tape according to the present invention have nearly the same thermal expansion coefficient each other, because they are composed of nearly the same kind of polyimides. Accordingly, the adhesive tape of the present invention causes less distortion in a range of from room temperature to an elevated temperature for heating and, consequently, it is excellent in processing ability.

In the adhesive tape for electronic parts of the present invention, the adhesive layers A and the adhesive layer B laminated on the metal substrate in order have each different Tg, as described above. The adhesive layers in the adhesive tape according to the present invention can be produced by forming polyimide layers on the metal substrate by known methods. The formation of the layers can be carried out, for example, according to a method which comprises applying a coating solution containing the abovementioned polyimide to a surface of the metal substrate such as copper plate and drying to form the adhesive layer A, and then applying a coating solution containing another polyimide which has a different glass transition temperature from that of the adhesive layer A to the surface of the formed adhesive layer A on the metal substrate and drying to form the adhesive layer B. It is possible to utilize other film formation methods, for example, a method which comprises bonding under pressure with heat a film corresponding to the adhesive layer A and a film corresponding to the adhesive layer B which are previously formed, and bonding the resulted laminate to a surface of a metal substrate under pressure with heat, and a method which comprises applying a coating solution containing the polyimide to a surface of a metal substrate and drying to form the adhesive layer A, and then bonding a film corresponding to the adhesive layer B having a different Tg to the surface of the formed adhesive layer A under pressure with heat.

It is also possible to form laminates of the adhesive layers A and B on both sides of the metal substrate or to form an additional adhesive layer on the laminate of the adhesive layers A and B by the above described methods.

In the adhesive tape for electronic parts of the present invention, the whole thickness which can be suitably varied is generally in a range of 10–250 $\mu$m.

In order to form the adhesive layer by application, a polyimide coating varnish obtained by dissolving the above described polyimide in a suitable solvent is used as the coating solution. Examples of the organic solvents used for dissolving the polyimide include various organic solvents such as aprotic polar solvents, e.g., N-methyl-2-pyrrolidone, N,N-dimethyl-acetamide, N,N-dimethylformamide, dimethylsulfoxide, sulforane, hexamethylphosphoric acid triamide, and 1,3-dimethyl-2-imidazolidone, phenol solvents such as phenol, cresol, xylenol and p-chlorophenol, etc., isophorone, cyclohexanone, carbitol acetate, diglyme, dioxane, tetrahydrofuran, etc. Moreover, alcoholic solvents such as methanol, ethanol and isopropanol, ester solvents such as methyl acetate, ethyl acetate and butyl acetate, nitrile solvents such as acetonitrile and benzonitrile, aromatic solvents such as benzene, toluene and xylene, halogen solvents such as chloroform and dichloromethane, and the like can be mixed and used in such a degree that the polyimide is not separated.

It is preferred to suitably control concentration and viscosity of the polyimide coating varnish according to the applications.

In the adhesive layers A and B formed on the metal substrate of the present, a filler having a particle size of not more than 1 $\mu$m may be incorporated for the purpose of controlling characteristics during the adhering. The content of the filler when being incorporated is preferably from 0.1 to 50% by weight, and more preferably from 0.4 to 25% by weight, based on the total solid content. If the content of the filler exceeds 50% by weight, the adhesion strength is remarkably lowered. Conversely, if it is less than 0.1% by weight, no effect of the addition of the filler can be obtained.

Examples of the fillers which can be used are silica, quarts powder, mica, alumina, diamond powder, zircon powder, calcium carbonate, magnesium oxide, fluorine containing resin, and the like.

In the adhesive tape of the present invention, it is possible to provide a releasing film having thickness of 1–200 $\mu$m as a protective film on the adhesive layer B. Typical examples of the releasing film used include resin films made of polyethylene, polypropylene, fluorine containing resin, polyethylene terephthalate, polyimide, etc. and paper, and those the surface of which is subjected to releasing treatment with a silicone releasing agent.

As be clear from the results of examination shown hereafter, the adhesive tape for electronic parts of the present invention has remarkably high reliability for adhering electronic parts, because of having sufficient heat resistance and adhesive strength. The adhesive tape of the present invention can be suitably used as an adhesive tape for the innerlead fix of the leadframe and a TAB tape, etc. and can be used for adhering between parts around leadframes making up a semiconductor device, for example, lead pins, semiconductor-mounted substrate, heat spreader, and semiconductor chips themselves.

EXAMPLE

The present invention will now be described in greater detail. First, examples for producing polyimides and coating varnishes containing polyimide used in the present invention shown.

Synthetic Example 1

Into a flask equipped with a stirrer were introduced 12.34 g (67 mmol) of 3,4'-diaminobiphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone at an iced temperature, and stirring was continued for 1 hour. Consequently, the solution was reacted at room temperature for 3 hours to synthesize a polyamic acid. To the resulting polyamic acid were added 50 ml of toluene and 1.0 g of p-toluenesulfonic acid, the mixture was heated to 160° C., and an imidation reaction was carried out for 3 hours while separating water which was flowed by being azeotropically distilled with toluene. After toluene was distilled off, the resulting polyimide varnish was poured in methanol, followed by separation of the resulting precipitate, pulverization, washing, and drying to obtain 50.0 g (yield: 95%) of a polyimide composed of the above mentioned repeating units in a proportion of [(1a)+(1b)]:[(2a)+(2b)]=67:33 wherein (1a):(1b)=100:0 and (2a):(2b)=100:0.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 2

Using 13.41 g (67 mmol) of 4,4'-oxydianiline, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.0 g (yield: 95%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 3

Using 13.29 g (67 mmol) of 4,4'-diaminodiphenylmethane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 52.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 4

Using 14.49 g (67 mmol) of 4,4'-diaminodiphenyl sulfide, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 51.0 g (yield:93%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 5

Using 16.64 g (67 mmol) of 3,3'-diaminodiphenyl sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b):[(2a)+(2b)]=67:33 wherein (1a):(1b)=100:0 and (2a):(2b)=100:0 was obtained in an amount of 51.5 g (yield: 90%) by the same manner as in Synthetic Example 1.

The IR spectrum measurement of the resultant polyimide showed typical absorption bands of imide at 1715 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 6

Using 15.16 g (67 mmol) of 2,2-bis(4-aminophenyl) propane, 8.20 g (33 mmol) of 1,3-bis(3-aminopropyl)-1,1, 3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 54.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 7

Using 22.40 g (67 mmol) of 2,2-bis(4-aminophenyl)hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of (1a)+(1b)]:[(2a)+(2b)]=67:33 wherein (1a):(1b)=100:0 and (2a):(2b)=100:0 was obtained in an amount of 60.0 g (yield: 95%) by the same manner as in Synthetic Example 1.

The IR spectrum measurement of the resultant polyimide showed typical absorption bands of imide at 1721 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 8

Using 19.58 g (67 mmol) of 1,4-bis(4-aminophenoxy)benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 58.0 g (yield: 97%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 9

Using 19.58 g (67 mmol) of 1,3-bis(4-aminophenoxy)benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 58.0 g (yield: 97%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 10

Using 23.08 g (67 mmol) of 1,3-bis[1-(4-aminophenyl)-1-methylethyl]benzene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 62.5 g (yield: 98%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 11

Using 24.68 g (67 mmol) of 4,4'-bis(4-aminophenoxy)biphenyl, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 64.0 g (yield:98%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 12

Using 25.75 g (67 mmol) of 4,4'-bis(4-aminophenoxy)diphenyl ether, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]= 67:33 wherein (1a):(1b)=100:0 and (2a):(2b)=100:0 was obtained in an amount of 64.0 g (yield: 97%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 13

Using 28.98 g (67 mmol) of bis[4-(4-aminophenoxy) phenyl]sulfone, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 65.0 g (yield: 94%) by the same manner as in Synthetic Example 1.

The IR spectrum measurement of the resultant polyimide showed typical absorption bands of imide at 1719 cm$^{-1}$ and 1785 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 14

Using 27.50 g (67 mmol) of 2,2-bis[4-(4-aminophenoxy) phenyl]propane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b))=67:33 wherein (1a):(1b)=100:0 and (2a):(2b)=100:0 was obtained in an amount of 65.0 g (yield: 96%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 15

Using 34.74 g (67 mmol) of 2,2-bis[4-(4-aminophenoxy) phenyl]hexafluoropropane, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 74.0 g (yield: 98%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 16

Using 23.35 g (67 mmol) of 9,9-bis(4-aminophenyl)fluorene, 8.20 g (33 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=67:33 wherein (1a):(1b)=100:0 and (2a):(2b)=100:0 was obtained in an amount of 60.5 g (yield: 95%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 17

Using 13.82 g (75 mmol) of 3,4'-diaminobiphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 18

Using 15.02 g (75 mmol) of 4,4'-oxydianiline, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 52.0 g (yield: 89%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 19

Using 14.87 g (75 mmol) of 4,4'-diaminodiphenylmethane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide consisting of the repeating units in a proportion of [(1a)+(1b)]:[(2a)+(2b)]=75:25 wherein (1a):(1b)=0:100 and (2a):(2b)=0:100 was obtained in an amount of 55.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 20

Using 16.22 g (75 mmol) of 4,4'-diaminodiphenyl sulfide, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 54.0 g (yield: 90%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 21

Using 18.63 g (75 mmol) of 3,3'-diaminodiphenyl sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 55.5 g (yield: 89%) by the same manner as in Synthetic Example 1.

The IR spectrum measurement of the resultant polyimide showed typical absorption bands of imide at 1715 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 22

Using 16.97 g (75 mmol) of 2,2-bis(4-aminophenyl) propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 57.0 g (yield: 94%) by the same manner as in Synthetic Example 1.

The IR spectrum measurement of the resultant polyimide showed typical absorption bands of imide at 1718 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 23

Using 25.07 g (75 mmol) of 2,2-bis(4-aminophenyl) hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 67.0 g (yield: 98%) by the same manner as in Synthetic Example 1.

The IR spectrum measurement of the resultant polyimide showed typical absorption bands of imide at 1721 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 24

Using 21.92 g (75 mmol) of 1,4-bis(4-aminophenoxy) benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 62.0 g (yield: 95%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 25

Using 21.92 g (75 mmol) of 1,3-bis(4-aminophenoxy) benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of ((1a)+(1b)]:[(2a)+(2b)]=75:25 wherein (1a):(1b)=0:100 and (2a):(2b)=0:100 was obtained in an amount of 64.0 g (yield: 97%) by the same manner as in Synthetic Example 1.

The IR spectrum measurement of the resultant polyimide showed typical absorption bands of imide at 1718 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 26

Using 25.84 g (75 mmol) of 1,3-bis[1-(4-aminophenyl)-1-methylethyl]benzene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and [(2a):(2b)]=0:100 was obtained in an amount of 67.0 g (yield: 96%) by the same manner as in Synthetic Example 1.

The IR spectrum measurement of the resultant polyimide showed typical absorption bands of imide at 1718 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 27

Using 27.63 g (75 mmol) of 4,4'-bis(4-aminophenoxy)biphenyl, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]: [(2a)+(2b)]=75:25 wherein (1a):(1b)=0:100 and (2a):(2b)=0:100 was obtained in an amount of 69.5 g (yield: 98%) by the same manner as in Synthetic Example 1.

The IR spectrum measurement of the resultant polyimide showed typical absorption bands of imide at 1718 $cm^{-1}$ and 1780 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 28

Using 28.82 g (75 mmol) of 4,4'-bis(4-aminophenoxy)diphenyl ether, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 70.0 g (yield: 97%) by the same manner as in Synthetic Example 1.

The IR spectrum measurement of the resultant polyimide showed typical absorption bands of imide at 1718 $cm^{-1}$ and 1783 $cm^-$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 29

Using 32.08 g (75 mmol) of bis[4-(4-aminophenoxy)phenyl]sulfone, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 74.0 g (yield: 97%) by the same manner as in Synthetic Example 1.

The IR spectrum measurement of the resultant polyimide showed typical absorption bands of imide at 1719 $cm^{-1}$ and 1785 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 30

Using 30.78 g (75 mmol) of 2,2-bis[4-(4-aminophenoxy)phenyl]propane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 73.0 g (yield: 98%) by the same manner as in Synthetic Example 1.

The IR spectrum measurement of the resultant polyimide showed typical absorption bands of imide at 1720 $cm^{-1}$ and 1783 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 31

Using 38.89 g (75 mmol) of 2,2-bis[4-(4-aminophenoxy)phenyl]hexafluoropropane, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 80.0 g (yield: 97%) by the same manner as in Synthetic Example 1.

The IR spectrum measurement of the resultant polyimide showed typical absorption bands of imide at 1715 $cm^{-1}$ and 1786 $cm^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 32

Using 26.14 g (75 mmol) of 9,9-bis(4-aminophenyl)fluorene, 6.21 g (25 mmol) of 1,3-bis(3-aminopropyl)-1,1,3,3-tetramethyldisiloxane, 41.03 g (100 mmol) of ethylene glycol bistrimellitate dianhydride, and 300 ml of N-methyl-2-pyrrolidone, a polyimide composed of the repeating units in a proportion of [(1a)+(1b)]:[(2a)+(2b)]=75:25 wherein (1a):(1b)=0:100 and (2a):(2b)=0:100 was obtained in an amount of 66.0 g (yield: 95%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 33

Using 20.53 g (50 mmol) of 2,2-bis[4-(4-aminophenoxy) phenyl]propane, 12.43 g (50 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=50:50 wherein (1a):(1b)=100:0 and (2a):(2b)=100:0 was obtained in an amount of 61.0 g (yield: 93%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 34

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 65.0 g (yield: 94%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 35

Using 32.84 g (80 mmol) of 2,2-bis[4-(4-aminophenoxy) phenyl]propane, 4.97 g (20 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=80:20 wherein (1a):(1b)=100:0 and (2a):(2b)=100:0 was obtained in an amount of 68.0 g (yield: 97%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 36

Using 36.95 g (90 mmol) of 2,2-bis[4-(4-aminophenoxy) phenyl]propane, 2.49 g (10 mmol) of 1,3-bis(3-aminopropyl)-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=90:10 wherein (1a):(1b)=100:0 and (2a):(2b)=100:0 was obtained in an amount of 69.0 g (yield: 97%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 37

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 17.91 g (50 mmol) of 3,3',4,4'-diphenylsulfonetetracarboxylic dianhydride, 20.53 g (50 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=50:50 and (2a):(2b)=50:50 was obtained in an amount of 68.5 g (yield: 95%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 38

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 8.96 g (25 mmol) of 3,3',4,4'-diphenylsulfonetetracarboxylic dianhydride, 30.77 g (75 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=25:75 and (2a):(2b)=25:75 was obtained in an amount of 69.5 g (yield: 95%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 39

Using 30.79 g (75 mmol) of 2,2-bis[4-(4-aminophenoxy) phenyl]propane, 6.21 g (25 mmol) of 1,3-bis(3-aminopropyl)-1,1,3,3-tetramethyldisiloxane, 26.87 g (75 mmol) of 3,3',4,4'-diphenylsulfonetetracarboxylic dianhydride, 10.26 g (25 mmol) of ethylene glycol bistrimellitate dianhydride and 300 ml of N-methyl-2-pyrrolidone, a polyimide composed of the repeating units in a proportion of [(1a)+(1b)]:[(2a)+(2b)]=75:25 wherein (1a):(1b)=75:25 and (2a):(2b)=75:25 was obtained in an amount of 66.0 g (yield: 94%) by the same manner as in Synthetic Example 1.

The IR spectrum measurement of the resultant polyimide showed typical absorption bands of imide at 1715 cm$^{-1}$ and 1786 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 40

Using 30.79 g (75 mmol) of 2,2-bis[4-(4-aminophenoxy) phenyl]propane, 9.42 g (25 mmol) of 1,3-bis[(aminophenoxy)methyl]-1,1,3,3-tetramethyldisiloxane, 35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 69.0 g (yield: 95%) by the same manner as in Synthetic Example 1.

The IR spectrum measurement of the resultant polyimide showed typical absorption bands of imide at 1720 cm$^{-1}$ and 1783 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 41

Using 30.79 g (75 mmol) of 2,2-bis[4-(4-aminophenoxy) phenyl]propane, 10.72 g (25 mmol) of aminopropyl terminated dimethylsiloxane tetramer represented by the following formula (5) wherein Y=NH$_2$, R=propylene, n=3:

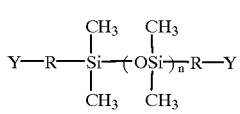

(5)

35.83 g (100 mmol) of 3,3',4,4'-diphenylsulfonetetracarboxylic dianhydride, and 300 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 67.0 g (yield: 91%) by the same manner as in Synthetic Example 1.

The IR spectrum measurement of the resultant polyimide showed typical absorption bands of imide at 1712 cm$^{-1}$ and 1783 cm$^{-1}$. The molecular weight, glass transition temperature and temperature of initiating thermal decomposition of the polyimide were determined. The results are shown in Table 1. The resultant polyimide was dissolved in tetrahydrofuran so as to be the concentration of 25% by weight to produce a coating varnish.

Synthetic Example 42

Using 31.04 g (100 mmol) of 4,4'-diamino-3,3',5,5'-tetraethyldiphenylmethane, 35.83 g (100 mmol) of 3,3',4,4'-diphenylsulfone tetracarboxylic dianhydride and 300 ml of N-methyl-2-pyrrolidone, a polyimide composed of the repeating units in a proportion of [(1a)+(1b)]:[(2a)+(2b)]=100:0 wherein (1a):(1b)=100:0 and (2a):(2b)=0:0 was obtained in an amount of 58.8 g (yield: 93%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 43

Using 15.52 g (50 mmol) of 4,4'-diamino-3,3',5,5'-tetraethyldiphenylmethane, 13.34 g (37.5 mmol) of 3,3',4,4'-diphenylsulfone tetracarboxylic dianhydride, 5.13 g (12.5 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=75:25 and (2a):(2b)=0:0 was obtained in an amount of 29.6 g (yield: 92%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 44

Using 15.52 g (50 mmol) of 4,4'-diamino-3,3',5,5'-tetraethyldiphenylmethane, 8.89 g (25 mmol) of 3,3',4,4'-diphenylsulfone tetracarboxylic dianhydride, 10.26 g (25 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=50:50 and (2a):(2b)=0:0 was obtained in an amount of 29.6 g (yield: 92%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 45

Using 7.76 g (25 mmol) of 4,4'-diamino-3,3',5,5'-tetraethyldiphenylmethane, 6.21 g (25 mmol) of bis(3-aminopropyl)tetramethyldisiloxane, 17.91 g (50 mmol), 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=50:50 wherein (1a):(1b)=100:0 and (2a):(2b)=100:0 was obtained in an amount of 27.4 g (yield: 91%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 46

Using 11.64 g (37.5 mmol) of 4,4'-diamino-3,3',5,5'-tetraethyldiphenylmethane, 3.11 g (12.5 mmol) of bis(3-aminopropyl)tetramethyldisiloxane, 17.91 g (50 mmol), 3,3',4,4'-diphenylsulfone tetracarboxylic dianhydride and 150 ml of N-methyl-2-pyrrolidone, a polyimide composed of the repeating units in a proportion of [(1a)+(1b)]:[(2a)+(2b)]=75:25 wherein (1a):(1b)=100:0 and (2a):(2b)=100:0 was obtained in an amount of 29.6 g (yield: 92%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 47

Using 12.72 g (50 mmol) of 4,4'-diamino-3,3',5,5'-tetraethyldiphenylmethane, 20.51 g (50 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=0:100 and (2a):(2b)=0:0 was obtained in an amount of 29.5 g (yield: 94%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature and temperature of initiating thermal decomposition of the polyimide were determined. The results are shown in Table 1.

The resultant polyimide was dissolved in tetrahydrofuran so as to be the concentration of 25% by weight to produce a coating varnish.

Synthetic Example 48

Using 15.52 g (50 mmol) of 4,4'-diamino-3,3',5,5'-tetramethyldiphenylmethane, 20.51 g (50 mmol) of ethylene glycol bistrimellitate dianhydride and 150 ml of N-methyl-2-pyrrolidone, a polyimide composed of the repeating units in a proportion of [(1a)+(1b)]:[(2a)+(2b)]=100:0 wherein (1a):(1b)=0:100 and (2a):(2b)=0:0 was obtained in an amount of 31.8 g (yield: 93%) by the same manner as in Synthetic Example 1.

The IR spectrum measurement of the resultant polyimide showed typical absorption bands of imide at 1720 cm$^{-1}$ and 1780 cm$^{-1}$. The molecular weight, glass transition temperature, and temperature of initiating thermal decomposition of the polyimide were determined. The results are shown in Table 1.

The resultant polyimide was dissolved in tetrahydrofuran so as to be the concentration of 25% by weight to produce a coating varnish.

TABLE 1

| Synthetic Ex. No. | Number average molecular weight | Glass transition temperature (° C.) | Temperature of initiating thermal decomposition (° C.) |
|---|---|---|---|
| 1 | 39,000 | 230 | 452 |
| 2 | 14,000 | 217 | 456 |
| 3 | 37,000 | 180 | 450 |
| 4 | 13,000 | 220 | 451 |
| 5 | 48,000 | 190 | 450 |
| 6 | 68,000 | 190 | 450 |
| 7 | 40,000 | 190 | 455 |
| 8 | 39,000 | 230 | 450 |
| 9 | 25,000 | 192 | 450 |
| 10 | 38,000 | 160 | 450 |
| 11 | 53,000 | 232 | 450 |
| 12 | 25,000 | 230 | 453 |
| 13 | 12,000 | 170 | 450 |
| 14 | 26,000 | 211 | 458 |
| 15 | 23,000 | 201 | 451 |
| 16 | 36,000 | 241 | 452 |
| 17 | 29,000 | 190 | 452 |
| 18 | 12,000 | 177 | 456 |
| 19 | 27,000 | 140 | 455 |
| 20 | 13,000 | 180 | 451 |
| 21 | 38,000 | 150 | 453 |
| 22 | 58,000 | 153 | 453 |
| 23 | 38,000 | 149 | 455 |
| 24 | 29,000 | 190 | 453 |
| 25 | 15,000 | 152 | 454 |
| 26 | 28,000 | 130 | 453 |
| 27 | 43,000 | 182 | 452 |
| 28 | 22,000 | 190 | 453 |
| 29 | 11,000 | 134 | 451 |
| 30 | 22,000 | 171 | 448 |
| 31 | 21,000 | 161 | 454 |
| 32 | 26,000 | 201 | 455 |
| 33 | 23,000 | 180 | 451 |
| 34 | 45,000 | 226 | 465 |
| 35 | 46,000 | 236 | 464 |
| 36 | 48,000 | 248 | 460 |
| 37 | 34,000 | 199 | 458 |
| 38 | 31,000 | 183 | 455 |
| 39 | 43,000 | 220 | 465 |
| 40 | 44,000 | 230 | 455 |
| 41 | 43,000 | 180 | 440 |
| 42 | 49,000 | 282 | 446 |
| 43 | 81,000 | 252 | 420 |
| 44 | 89,000 | 226 | 410 |
| 45 | 26,000 | 186 | 458 |
| 46 | 69,000 | 224 | 421 |
| 47 | 37,000 | 232 | 400 |
| 48 | 31,000 | 200 | 421 |

In the above Table 1, the measurement of the molecular weight of polyimides was carried out using tetrahydrofuran as an eluent and Shodex 80M X 2 as a column. Value of the molecular weight is a number average molecular weight which is calculated as polystyrene. The glass transition temperature was determined by a differential thermal analysis (in a nitrogen atmosphere, heated at 10° C./min.) and the temperature of initiating thermal decomposition was determined by a thermogravimetry (in a nitrogen atmosphere, heated at 10° C./min.)

Comparative Synthetic Example 1

Using 16.40 g (40 mmol) of 2,2-bis[4-(4-aminophenoxy)phenyl]propane, 8.42 g (40 mmol) of trimellitic acid anhydride monochloride and 120 ml of N-methyl-2-pyrrolidone, a polyether amidoimide was obtained in an amount of 20.8 g (yield: 92%) by the same manner as in Synthetic Example 1.

The IR spectrum measurement of the resultant polyether amidoimide showed typical absorption bands of imide at 1715 $cm^{-1}$ and 1786 $cm^{-1}$ and a typical absorption band of amide at 1630 $cm^{-1}$. It has a molecular weight of 21,000, Tg of 228° C. and temperature of initiating thermal decomposition of 430° C.

The resultant polyether amidoimide was dissolved in tetrahydrofuran so as to be the concentration of 25% by weight to produce a coating varnish.

Comparative Synthetic Example 2

Using 8.01 g (40 mmol) of 4,4'-diaminodiphenyl ether, 10.80 g (40 mmol) of biphenyltetracarboxylic dianhydride and 120 ml of N-methyl-2-pyrrolidone, a polyimide was obtained in an amount of 16.1 g (yield: 93%) by the same manner as in Synthetic Example 1.

The IR spectrum measurement of the resultant polyether amidoimide showed typical absorption bands of imide at 1715 $cm^{-1}$ and 1786 $cm^{-1}$. The molecular weight of it could not be measured by the above mentioned method, because it did not dissolve in tetrahydrofuran. Tg of it was 290° C. and temperature of initiating thermal decomposition of it was 560° C. The resultant polyimide was dissolved in o-dichlorophenol so as to be the concentration of 20% by weight to produce a coating varnish.

Comparative Synthetic Example 3

20.80 g (40 mmol) of 2,2-bis[(1,2-dicarboxy)-4-phenoxyphenyl]propane dianhydride and 8.42 g (40 mmol) of trimellitic acid anhydride monochloride were dissolved in 120 ml of N-methyl-2-pyrrolidone. To the resulted solution was added 4.34 g (0.04 mol) of m-phenylenediamine, and the mixture was stirred at 0° C. for 4 hours to obtain a solution containing 20% by weight of polyamic acid. The resultant solution was used as the coating varnish. A resin obtained by polyether-imidation had Tg of 216° C. and temperature of initiating thermal decomposition of 510° C.

The IR spectrum measurement of the resultant resin showed typical absorption bands of imide at 1715 $cm^{-1}$ and 1786 $cm^{-1}$. The molecular weight of the resin could not be measured by the above mentioned method, because it did not dissolve in tetrahydrofuran.

Example 1

The coating varnish containing the polyimide obtained in Synthetic Example 42 was applied to a surface of a copper plate having the thickness of 50 g m by a bar-coater so as to a dried thickness of 20 μm, and dried in a hot air circulating oven at 150° C. for 5 minutes to form an adhesive layer A on the copper plate. Then, the coating varnish containing the polyimide obtained in Synthetic Example 2 (Tg of which was different from that of the polyimide of Synthetic Example 42) was applied to the surface of the adhesive layer A formed on the copper plate so as to a dried thickness of 20 μm, and dried in a hot air circulating oven at 150° C. for 10 minutes to form an adhesive layer B. Thus an adhesive tape having the total thickness of 90 μm was obtained, in which the copper plate, the adhesive layer A and the adhesive layer B composed of polyimides having each a different Tg were laminated in order.

Examples 2–40

Adhesive tapes were produced by the same manner as in Example 1, except that each coating varnish containing the polyimide in the above described Synthetic Examples was used. Alumina filler having the particle size of 0.05 μm (produced by Showa Denko K. K.) was added in an amount of 10% by weight to the adhesive layer B in Example 37 and to the adhesive layer A in Example 38. Silica filler having the particle size of 0.07 μm (produced by Arakawa Chemical Industries, Ltd,) was added in an amount of 10% by weight to the adhesive layer B in Example 39 and to the adhesive layer A in Example 40.

Example 41

An adhesive tape was produced by the same manner as in Example 1, except that a 100 μm thick copper plate.

Example 42

An adhesive tape was produced by the same manner as in Example 1, except that a 200 μm thick copper plate.

Coating varnishes used in examples 1–42, fillers and amounts thereof, and adhesion temperatures of the formed adhesive layers are shown in Table 2. The glass transition temperatures of the adhesive layer A and B in Table 2 are those of the corresponding Synthetic Examples shown in Table 1.

Comparative Example 1

Using the coating varnish obtained in Synthetic Example 10 instead of the coating varnish obtained in Synthetic Example 42, adhesive layers corresponding to the adhesive layers A and B were formed on a surface of the copper plate by the same manner as in Example 1 to produce a comparative adhesive tape in which the adhesive layers contained polyimides having each the same glass transition temperature.

Comparative Example 2

The coating varnish containing polyimide obtained in Synthetic Example 42 was applied to a side of 50 μm thick heat resisting polyimide film (Upilex 50S, produced by Ube Industries, Ltd.) by a bar-coater so as to a dried thickness of 20 μm, and dried in a hot air circulating oven at 150° C. for 5 minutes to form an adhesive layer corresponding to the adhesive layer A on the polyimide film. Thereafter, the coating varnish containing polyimide obtained in Synthetic Example 2 (Tg of which is different from that of polyimide obtained in Synthetic Example 42) was applied to the other side of the polyimide film so as to a dried thickness of 20 μm, and dried in a hot air circulating oven at 150° C. for 10 minutes to form an adhesive layer corresponding to the adhesive layer B. Thus an adhesive sheet in which adhesive layers having each a different glass transition temperature were formed on both sides of the polyimide film separately was obtained. The resultant adhesive sheet was bonded to the same copper plate as that used in Example 1 under pressure with heat so as to face the adhesive layer corresponding to the adhesive layer A to the copper plate, by which a comparative adhesive tape was obtained. The bonding was carried out by heating to 360° C. under the pressure of 4 kgf/cm² for 2 seconds.

Comparative Example 3

A polyimide varnish (LARK TPI, produced by MITSUI TOATSU CHEMICALS INC.) was dissolved in N-methyl-2-pyrrolidone to prepare a 20 wt. % solution. The resultant solution was applied to a surface of the same copper plate as that used in Example 1 so as to a dried thickness of 20 μm, and dried in a hot air circulating oven at 150° C. for 2 hours to form an adhesive layer corresponding to the adhesive layer A. Thereafter, the same solution was applied to the adhesive layer formed on the copper plate so as to a dried thickness of 20 μm, and dried in a hot air circulating oven at 150° C. for 2 hours and additionally at 250° C. for 1 hour under nitrogen atmosphere to form an adhesive layer corresponding to the adhesive layer B, by which a comparative adhesive tape was obtained.

Comparative Example 4

A polyimide varnish (LARK TPI, produced by MITSUI TOATSU CHEMICALS INC.) was dissolved in N-methyl-2-pyrrolidone to prepare a 20 wt. % solution. The resultant solution was applied to a side of the same polyimide film as that used in Comparative Example 2 so as to a dried thickness of 20 μm, and dried in a hot air circulating oven at 150° C. for 2 hours. The same solution was then applied to the other side of the polyimide film so as to a dried thickness of 20 μm and dried in a hot air circulating oven at 150° C. for 2 hours and additionally at 250° C. for 1 hour to produce an adhesive sheet. The resultant adhesive sheet was placed on a surface of the same copper plate as that used in Example 1 and bonded under pressure with heat in a nitrogen atmosphere to produce a comparative adhesive tape. The bonding was carried out by heating to 380° C. under the pressure of 4 kgf/cm² for 2 seconds.

Comparative Example 5

A polyimide varnish (LARK TPI, produced by MITSUI TOATSU CHEMICALS INC.) was dissolved in N-methyl-2-pyrrolidone to prepare a 20 wt. % solution. The resultant solution was applied to a surface of the same copper plate as that used in Example 1 so as to a dried thickness of 20 μm, and dried in a hot air circulating oven at 150° C. for 2 hours and additionally at 250° C. for 1 hour in a nitrogen atmosphere to form an adhesive layer corresponding to the adhesive layer A. Thereafter, a coating varnish containing polyether amidoimide obtained in Comparative Example 1 was applied to the adhesive layer formed on the copper plate so as to a dried thickness of 20 μm, and dried in a hot air circulating oven at 150° C. for 10 minutes to form an adhesive layer corresponding to the adhesive layer B, by which a comparative adhesive tape was obtained.

Comparative Example 6

A coating varnish containing polyimide obtained in Comparative Example 2 was applied to a surface of the same copper plate as that used in Example 1 so as to a dried thickness of 20 μm, and dried in a hot air circulating oven at 150° C. for 2 hours to form an adhesive layer corresponding to the adhesive layer A. Thereafter, a coating varnish which was a 20 wt. % solution of polyimide (Torlon 400T, produced by AMOCO CORP.) in N-methyl-2-pyrrolidone was applied to the adhesive layer formed on the copper plate so as to a dried thickness of 20 μm, and dried in a hot air circulating oven at 150° C. for 10 minutes to form an adhesive layer corresponding to the adhesive layer B, by which a comparative adhesive tape was obtained.

Comparative Example 7

A coating varnish containing polyimide obtained in Comparative Example 2 was applied to a surface of the same copper plate as that used in Example 1 so as to a dried thickness of 20 μm, and dried in a hot air circulating oven at 150° C. for 2 hours to form an adhesive layer corresponding to the adhesive layer A. Thereafter, a coating varnish which was a 20 wt. % solution of polyamic acid obtained in Comparative Example 3 in N-methyl-2-pyrrolidone was applied to the adhesive layer formed on the copper plate so as to a dried thickness of 20 μm, and dried in a hot air circulating oven at 150° C. for 1 hour and additionally at 250° C. for 1 hour in a nitrogen atmosphere to form an adhesive layer corresponding to the adhesive layer B, by which a comparative adhesive tape was obtained.

Regarding comparative adhesive tapes of Comparative Examples 1–7, coating varnishes for the adhesive layers, fillers and amounts thereof, and adhesion temperatures of the formed adhesive layers are also shown in Table 3.

TABLE 2

| Adhesive tape | Adhesive layer A | | Adhesive layer B | | Adhesion temperature of Adhesive layer B (° C.) |
| | Coating varnish | Filler (wt. %) | Coating varnish | Filler (wt. %) | |
| --- | --- | --- | --- | --- | --- |
| Ex. 1 | Syn. Ex. 42 | 0 | Syn. Ex. 2 | 0 | 300 |
| Ex. 2 | Syn. Ex. 1 | 0 | Syn. Ex. 3 | 0 | 260 |
| Ex. 3 | Syn. Ex. 11 | 0 | Syn. Ex. 5 | 0 | 270 |
| Ex. 4 | Syn. Ex. 8 | 0 | Syn. Ex. 6 | 0 | 270 |
| Ex. 5 | Syn. Ex. 11 | 0 | Syn. Ex. 7 | 0 | 270 |
| Ex. 6 | Syn. Ex. 43 | 0 | Syn. Ex. 9 | 0 | 280 |
| Ex. 7 | Syn. Ex. 4 | 0 | Syn. Ex. 10 | 0 | 240 |
| Ex. 8 | Syn. Ex. 12 | 0 | Syn. Ex. 13 | 0 | 250 |
| Ex. 9 | Syn. Ex. 16 | 0 | Syn. Ex. 14 | 0 | 300 |
| Ex. 10 | Syn. Ex. 43 | 0 | Syn. Ex. 15 | 0 | 290 |
| Ex. 11 | Syn. Ex. 43 | 0 | Syn. Ex. 17 | 0 | 270 |
| Ex. 12 | Syn. Ex. 34 | 0 | Syn. Ex. 18 | 0 | 260 |
| Ex. 13 | Syn. Ex. 35 | 0 | Syn. Ex. 19 | 0 | 220 |
| Ex. 14 | Syn. Ex. 36 | 0 | Syn. Ex. 20 | 0 | 260 |
| Ex. 15 | Syn. Ex. 39 | 0 | Syn. Ex. 21 | 0 | 230 |
| Ex. 16 | Syn. Ex. 40 | 0 | Syn. Ex. 22 | 0 | 240 |

TABLE 2-continued

| Adhesive tape | Adhesive layer A Coating varnish | Filler (wt. %) | Adhesive layer B Coating varnish | Filler (wt. %) | Adhesion temperature of Adhesive layer B (° C.) |
|---|---|---|---|---|---|
| Ex. 17 | Syn. Ex. 42 | 0 | Syn. Ex. 23 | 0 | 230 |
| Ex. 18 | Syn. Ex. 43 | 0 | Syn. Ex. 24 | 0 | 270 |
| Ex. 19 | Syn. Ex. 44 | 0 | Syn. Ex. 25 | 0 | 240 |
| Ex. 20 | Syn. Ex. 46 | 0 | Syn. Ex. 26 | 0 | 210 |
| Ex. 21 | Syn. Ex. 47 | 0 | Syn. Ex. 27 | 0 | 250 |
| Ex. 22 | Syn. Ex. 34 | 0 | Syn. Ex. 28 | 0 | 260 |
| Ex. 23 | Syn. Ex. 34 | 0 | Syn. Ex. 29 | 0 | 250 |
| Ex. 24 | Syn. Ex. 43 | 0 | Syn. Ex. 30 | 0 | 290 |
| Ex. 25 | Syn. Ex. 46 | 0 | Syn. Ex. 31 | 0 | 260 |
| Ex. 26 | Syn. Ex. 43 | 0 | Syn. Ex. 32 | 0 | 290 |
| Ex. 27 | Syn. Ex. 46 | 0 | Syn. Ex. 33 | 0 | 260 |
| Ex. 28 | Syn. Ex. 43 | 0 | Syn. Ex. 37 | 0 | 280 |
| Ex. 29 | Syn. Ex. 46 | 0 | Syn. Ex. 38 | 0 | 270 |
| Ex. 30 | Syn. Ex. 46 | 0 | Syn. Ex. 41 | 0 | 260 |
| Ex. 31 | Syn. Ex. 46 | 0 | Syn. Ex. 45 | 0 | 290 |
| Ex. 32 | Syn. Ex. 43 | 0 | Syn. Ex. 48 | 0 | 280 |
| Ex. 33 | Syn. Ex. 35 | 0 0 | Syn. Ex. 1/Syn. Ex. 10 (6/4) | 0 | 280 |
| Ex. 34 | Syn. Ex. 35 | 0 0 | Syn. Ex. 16/Syn. Ex. 10 (5/5) | 0 | 280 |
| Ex. 35 | Syn. Ex. 35 | 0 0 | Syn. Ex. 33/Syn. Ex. 36 (5/5) | 0 | 280 |
| Ex. 36 | Syn. Ex. 35 | 0 0 | Syn. Ex. 8/Syn. Ex. 26 (2/8) | 0 | 230 |
| Ex. 37 | Syn. Ex. 35 | 0 | Syn. Ex. 10 | Almina 10 | 270 |
| Ex. 38 | Syn. Ex. 14 | Almina 10 | Syn. Ex. 45 | 0 | 290 |
| Ex. 39 | Syn. Ex. 35 | 0 | Syn. Ex. 10 | Silica 10 | 270 |
| Ex. 40 | Syn. Ex. 14 | Silica 10 | Syn. Ex. 45 | 0 | 290 |
| Ex. 41 | Syn. Ex. 42 | 0 | Syn. Ex. 2 | 0 | 300 |
| Ex. 42 | Syn. Ex. 42 | 0 | Syn. Ex. 2 | 0 | 300 |

TABLE 3

| Comparative Adhesive | Adhesive layer corresponding to Adhesive layer A Coating varnish | Filler (wt. %) | Insulating film between adhesive layers | Adhesive layer corresponding to Adhesive layer B Coating varnish | Filler (wt. %) | Adhesion temperature of Adhesive layer B (° C.) |
|---|---|---|---|---|---|---|
| Com. Ex. 1 | Syn. Ex. 10 | 0 | — | Syn. Ex. 10 | 0 | 240 |
| Com. Ex. 2 | Syn. Ex. 42 | 0 | Polyimide | Syn. Ex. 2 | 0 | 300 |
| Com. Ex. 3 | Lark TPI | 0 | — | Lark TPI | 0 | 380 |
| Com. Ex. 4 | Lark TPI | 0 | Polyimide | Lark TPI | 0 | 380 |
| Com. Ex. 5 | Lark TPI | 0 | — | Com. Syn. Ex. 1 | 0 | 310 |
| Com. Ex. 6 | Com. Syn. Ex. 2 | 0 | — | Torlon 400T | 0 | 310 |
| Com. Ex. 7 | Com. Syn. Ex. 2 | 0 | — | Com. Syn. Ex. 3 | 0 | 300 |

In order to evaluate the adhesive tapes obtained in the Examples and Comparative Examples, the following operations were carried out.

Assembling of Leadframe

The leadframe used in a semiconductor package as shown in FIG. 1 was assembled according to the following procedures.

(a) Punching of Adhesive Tape

The adhesive tape was subjected to punch dying in a desired form by a mold.

(b) Assembling of Leadframe

The adhesive tape punched and a leadframe were positioned and heated under pressure (4 kgf/cm$^2$/1 second in nitrogen atmosphere) on a hot plate heated so that the leadframe adhered to the lower Tg adhesive layer of the adhesive tape. The adhesion temperature in this stage is shown in Tables 2 and 3 as Adhesion temperature of adhesive layer B.

Assembling of Semiconductor Package

Thereafter, the produced leadframe was used to assemble a package according to the following procedures. The reason why the conditions of adhesion and curing were different at the time of assembling the leadframe is that the characteristics of the adhesive tapes are different from each other. Here, optimum conditions for each adhesive tape were selected and the adhesion was carried out based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with agold wire.

(c) Molding

Using an epoxy molding compound, transfer molding was carried out.

(d) Finishing Stage

Via stages of forming, dum cutting, solder plating on the outer leads, etc., the packaging was finished. (The Results of Evaluations of Adhesive Tapes and Semi-conductor Packages (n=10))

(a) Adhesion strength

A 90° peel strength of 10 mm wide tape at room temperature was measured after the adhesive tape was adhered (taped) onto a copper plate under the same condition at assembling the leadframe. As the result, the adhesive tapes of Examples 1–42 were found to have a strength ranging from 35–50 g/10 mm, while the adhesive tapes of Comparative Examples 2, 4, 5, 6 and 7 had the strength of 10–40 g/10 mm which meant a large variation. In the adhesive tapes of Comparative Examples 2 and 4, some of them caused interfacial separation between the base film and the adhesive layer. In the adhesive tapes of Comparative Examples 5–7, some of them caused interfacial separation of the adhesive layer from the other adhesive layer.

(b) Embedding of Lead pins

The state of lead pins burying in the adhesive tape was observed when the leadframe had been assembled. In the adhesive tape of Examples 1–42, embedding of the lead pins did not change from the state of assembling of the leadframe, that is, the lead pins were not embedded beyond the interface of the adhesive layer A and the adhesive layer B. On the contrary, in the comparative adhesive tapes of Comparative Examples 1, 3 and 6, distortion or movement of some of lead pins was observed when the adhesion of the semiconductor chip was carried out, by which the flatness of the lead pins was damaged. In concrete, in case of the adhesive tapes of Comparative Examples 1 and 3, some of the lead pins contacted with the copper plate. In case of the adhesive tapes of Comparative Example 6, the lead pins embedded into the adhesive layer corresponding to the adhesive layer A. In the adhesive tapes of Comparative Examples 5 and 7, the lead pins were not embedded beyond the interface of the adhesive layer A and the adhesive layer B.

(c) Evaluation of Semiconductor packages

The package obtained as described above were tested using the PCBT Test (Pressure Cooker Biased Test). This test was carried out at 5 volts of applied voltage at 121° C., at 2 atmospheres and at 100% relative humidity, in order to test electrical reliability. As the result, the adhesive tapes of Examples 1–42 did not cause shorting even after 1,000 hours. On the contrary, 3 samples caused shorting in case of the adhesive tape of Comparative Example 1, and 4 samples caused shorting in case of the adhesive tape of Comparative Example 3. In case of the adhesive tapes of Comparative Examples 2 and 4–7, though no shorting took place, there are observed interfacial separation between the polyimide film and the adhesive layer in case of the adhesive tapes of Comparative Examples 2 and 4, and interfacial separation between the adhesive layer corresponding to the adhesive layer A and the adhesive layer corresponding to the adhesive layer B.

As is clear from the results described above, in the case of the adhesive tapes of the present invention, the semiconductor package can be produced in agood manner. In contrast, the adhesive tapes of Comparative Examples are not suitable for manufacturing electronic parts because of causing troubles that the lead pins are embedded in the adhesive layers, shorting is caused by the test for electrical reliability, or the adhesive tape has large variation of adhesive strength.

What is claimed is:

1. An adhesive tape for electronic parts comprising a metal substrate, and an adhesive layer A and an adhesive layer B laminated in this order on said metal substrate, wherein said adhesive layers A and B are resin layers comprising polyimides each of which is composed of 100 to 40% by mol of repeating units represented by at least one of the following formulas (1a) and (1b) and 0 to 60% by mol of repeating units represented by at least one of the following formulas (2a) and (2b), the molar percentage of the repeating units represented by the at least one of the formulas (2a) and (2b) in the polyimide in the adhesive layer B is higher than the molar percentage of the repeating units represented by the at least one of the formulas (2a) and (2b) in the polymide in the adhesive layer A, and said adhesive layers A and B having different glass transition temperatures:

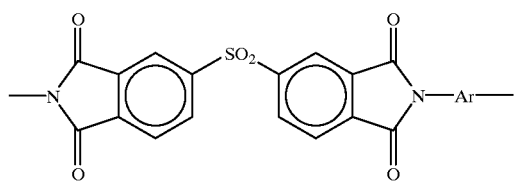

(1a)

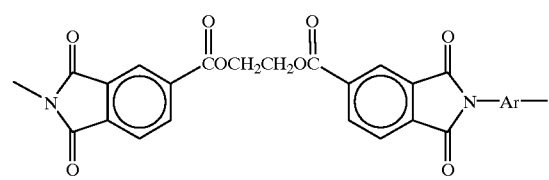

(1b)

wherein Ar represents a divalentgroup selected from the following formulas containing aromatic rings:

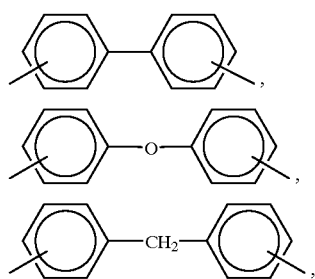

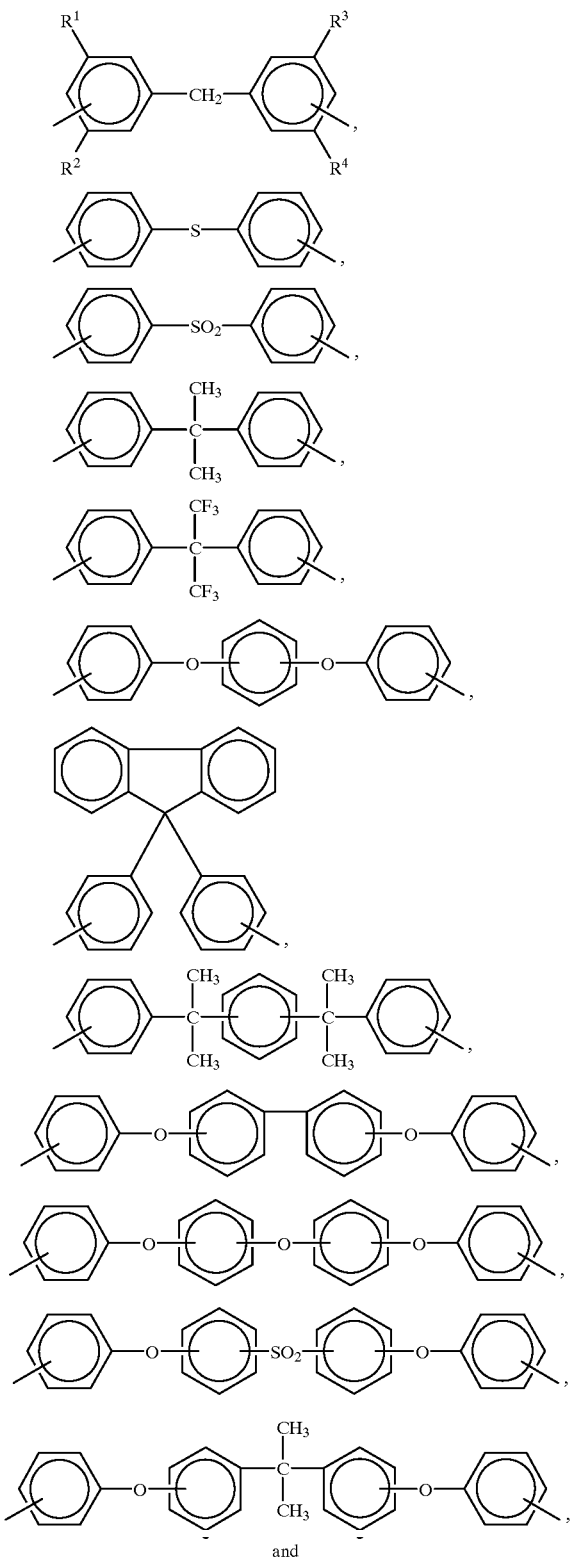

and

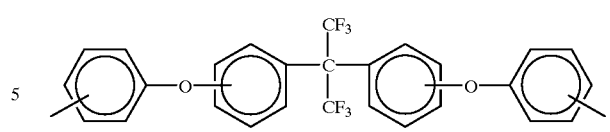

wherein $R^1$, $R^2$, $R^3$ and $R^4$ may be the same or different and each independently represent a hydrogen atom, an alkyl group having to 4 carbon atoms or an alkoxy group having 1 to 4 carbon atoms, with a proviso that $R^1$, $R^2$, $R^3$ and $R^4$ are not hydrogen atoms at the same time, (2a)

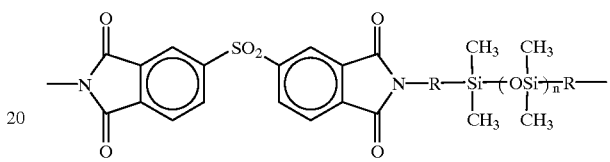

(2b)

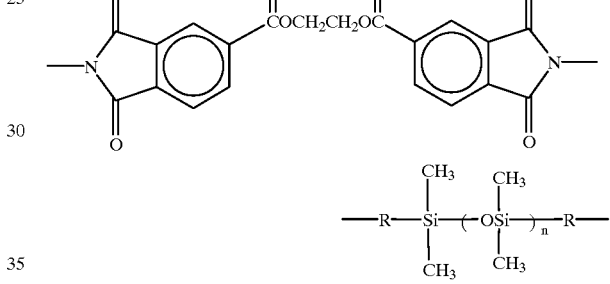

wherein R is an alkylene group having 1 to 10 carbon atoms or —$CH_2OC_6H_4$—, the methylene group of which is bonded to its adjacent Si atom, and n means an integer of 1 to 20.

2. The adhesive tape for electronic parts as claimed in claim 1, wherein the adhesive layer A has a higher glass transition temperature than that of the adhesive layer B.

3. The adhesive tape for electronic parts as claimed in claim 2, wherein the glass transition temperature of the adhesive layer A is at least 40° C. higher than that of the adhesive layer B.

4. The adhesive tape for electronic parts as claimed in claim 1, wherein at least one of the adhesive layers A and B contains a filler having a particle size of not more than 1 μm in an amount of from 0.1 to 50% by weight.

5. The adhesive tape for electronic parts as claimed in claim 1, wherein a releasing film is provided on a surface of the adhesive layer B.

6. The adhesive tape for electronic parts as claimed in claim 1, wherein the metal substrate has a thickness of from 10 to 300 μm.

7. The adhesive tape for electronic parts as claimed in claim 1, wherein the metal substrate is composed of at least one metal selected from the group consisting of copper, cupro-nickel, silver, iron, 42-alloy and stainless steel.

* * * * *